United States Patent
Saito

(10) Patent No.: US 11,222,806 B2
(45) Date of Patent: Jan. 11, 2022

(54) TAPE, TAPE ATTACHING METHOD, AND TAPE EXPANDING METHOD

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 6 days.

(21) Appl. No.: 16/549,094

(22) Filed: Aug. 23, 2019

(65) Prior Publication Data

US 2020/0075387 A1 Mar. 5, 2020

(30) Foreign Application Priority Data

Sep. 3, 2018 (JP) .............................. JP2018-164512

(51) Int. Cl.
  *B32B 41/00* (2006.01)
  *H01L 21/683* (2006.01)
  *C09J 7/00* (2018.01)

(52) U.S. Cl.
  CPC ............ *H01L 21/6836* (2013.01); *C09J 7/00* (2013.01); *C09J 2203/326* (2013.01); *H01L 2221/68327* (2013.01)

(58) Field of Classification Search
  CPC ....... H01L 21/6836; H01L 2221/68327; H01L 2221/68336; C09J 7/00; C09J 2203/326; C09J 7/38; C09J 2301/50; G01L 5/04
  (Continued)

(56) References Cited

U.S. PATENT DOCUMENTS 6,983,686 B2 * 1/2006 Vaughn ..................... B31F 1/07
                                                                101/226
2010/0285398 A1 * 11/2010 Hogerton .............. G09F 3/0292
                                                                   430/2
(Continued)

FOREIGN PATENT DOCUMENTS

JP      2010206136 A    9/2010
JP      2018006618 A    1/2018

OTHER PUBLICATIONS

Jariyapunya, Nareerut & Baheti, Smita. (2017). Application of image analysis method for measurement of fabric stretch deformation. IOP Conference Series: Materials Science and Engineering. 254. 142010. 10.1088/1757-899X/254/14/142010. (Year: 2017) https://www.researchgate.net/publication/320951495_Application_of_image_analysis_method_for_measurement_of_fabric_stretch_deformation (Year: 2017).*

*Primary Examiner* — Michael N Orlando
*Assistant Examiner* — Joshel Rivera
(74) *Attorney, Agent, or Firm* — Greer, Burns & Crain, Ltd.

(57) ABSTRACT

A tape adapted to be attached to a workpiece. The tape has a pattern for checking tension applied to the tape. The pattern is provided on the whole or part of the front side of the tape. The tension may be checked before expansion of the tape, during expansion of the tape, or after expansion of the tape. The tension may be checked after attaching the tape to the workpiece. By using a tape expander having four holding units holding the four side edge portions of the tape, the tape is expanded by moving the four holding units holding the tape so that the holding units are moved away from the workpiece. Deformation of the pattern due to the expansion of the tape is checked by visual inspection or by (Continued)

using an imaging camera to thereby determine the attached condition of the tape to the workpiece.

10 Claims, 7 Drawing Sheets

(58) Field of Classification Search
USPC .................. 156/64, 350, 351, 378, 379, 60
See application file for complete search history.

(56) References Cited

U.S. PATENT DOCUMENTS

2011/0064948 A1* 3/2011 Plaut ...................... H01L 21/78
428/355 EP
2016/0128877 A1* 5/2016 Chandrasekaran ... A61L 24/046
24/306

* cited by examiner

TAPE, TAPE ATTACHING METHOD, AND TAPE EXPANDING METHOD

BACKGROUND OF THE INVENTION

Field of the Invention

The present invention relates to a tape adapted to be attached to a workpiece, a tape attaching method for attaching the tape to the workpiece, and a tape expanding method for expanding the tape attached to the workpiece.

Description of the Related Art

In processing a workpiece such as a semiconductor wafer, a tape is attached to the workpiece. For example, in grinding the back side of a semiconductor wafer, a tape is attached to the front side of the semiconductor wafer, so as to protect devices formed on the front side of the semiconductor wafer. In dicing a semiconductor wafer, a dicing tape is attached to the back side of the semiconductor wafer. Further, an expandable tape is attached to a semiconductor wafer inside which a modified layer has been formed by laser processing. In this case, by expanding the expandable tape, the semiconductor wafer is divided into individual device chips along the modified layer as a division start point (see JP 2010-206136A and JP 2018-6618A, for example).

In this manner, a tape is attached to a workpiece according to the kind of processing or the step of processing. However, in the case where the tape is attached to the workpiece under improper tension, various problems may be caused by such improper tension. For example, in the case where a dicing tape is attached to the back side of a semiconductor wafer in dicing the semiconductor wafer and where the tension applied to the dicing tape is not proper, possible contact of devices chips obtained by dicing the semiconductor wafer may be caused by such improper tension. Further, in the case where an expandable tape is attached to a semiconductor wafer inside which a modified layer has been formed and where the tension applied to the expandable tape is not proper, there is a possibility that a force applied to the semiconductor wafer in expanding the expandable tape may become nonuniform. Also in the case where the expandable tape is nonuniformly expanded, the force applied to the semiconductor wafer may become nonuniform. As a result, there is a problem such that the semiconductor wafer may not be divided into device chips in some portion. To cope with the above problems, the tension applied to the tape is checked by using a noncontact type tension meter.

SUMMARY OF THE INVENTION

However, in general, the noncontact tension meter for measuring the tension to an adhesive tape attached to a workpiece is so designed as to measure the tension by using sound wave. Accordingly, it is necessary to vibrate the adhesive tape. However, in the case where the adhesive tape attached to the workpiece is vibrated, there is a possibility that the workpiece may be broken. Further, there is also a case where the tension may be improperly measured due to ambient sound about the acoustic type tension meter.

It is therefore an object of the present invention to provide a tape which can facilitate the check of the tension without the measurement using sound wave.

It is another object of the present invention to provide a tape attaching method using the tape mentioned above.

It is a further object of the present invention to provide a tape expanding method using the tape mentioned above.

In accordance with an aspect of the present invention, there is provided a tape adapted to be attached to a workpiece, the tape having a pattern for checking tension applied to the tape.

Preferably, the pattern is provided on the whole surface of one side of the tape.

In accordance with another aspect of the present invention, there is provided a tape attaching method for attaching a tape to a workpiece, the tape having a pattern for checking tension applied to the tape, the tape attaching method including: a tape preparing step of preparing the tape; a tape attaching step of attaching the tape to the workpiece; and a determining step of checking the tension applied to the tape according to deformation of the pattern after performing the tape attaching step, and then determining whether or not an attached condition of the tape to the workpiece is good.

In accordance with a further aspect of the present invention, there is provided a tape expanding method for expanding a tape attached to a workpiece, the tape having a pattern for checking tension applied to the tape, the tape expanding method including: an attaching step of attaching the tape to the workpiece; an expanding step of expanding the tape after performing the attaching step; and a tension checking step of checking the tension applied to the tape according to deformation of the pattern.

According to the present invention, the tape having a pattern is used and deformation of the pattern is observed, so that the tension applied to the tape can be easily determined.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Tape

Figure 1:
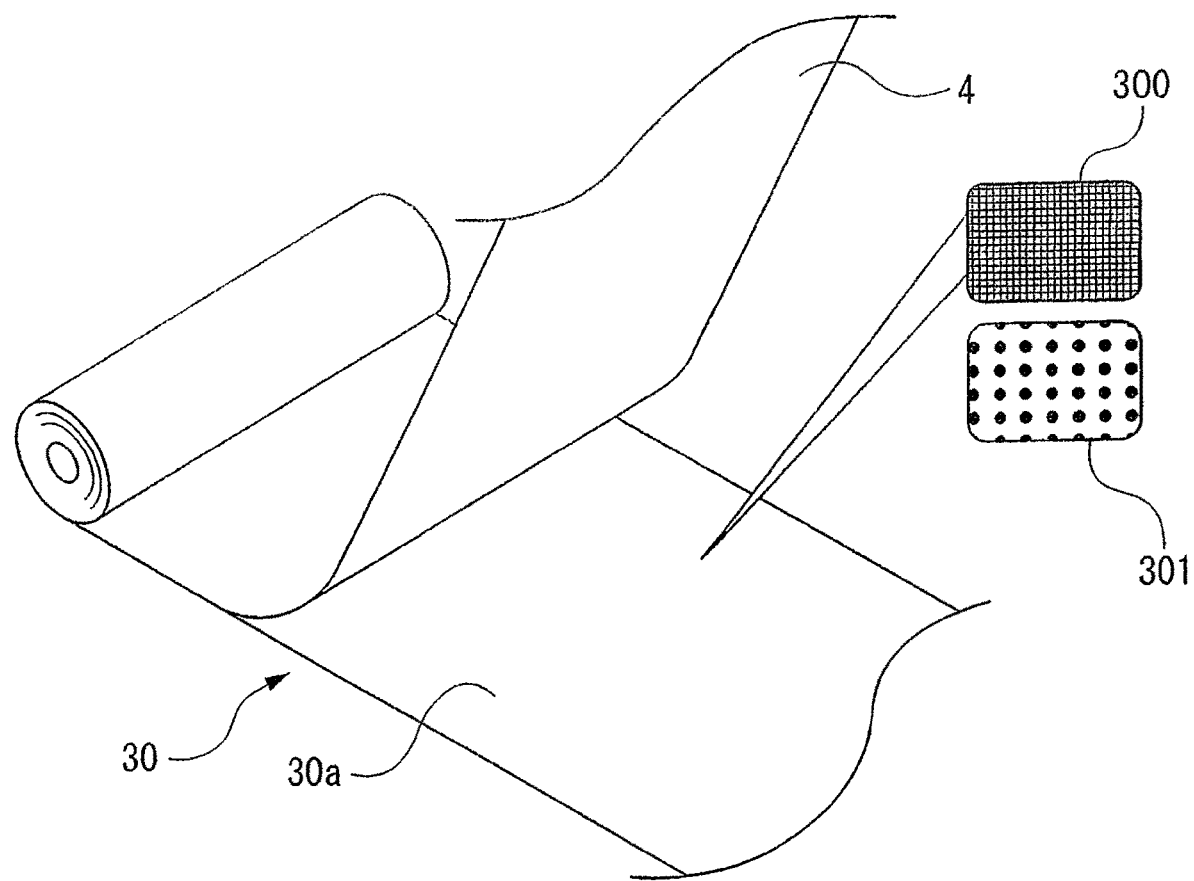
FIG. 1 is a perspective view depicting a tape having a pattern according to the present invention.

Referring to FIG. 1, a tape 30 according to a preferred embodiment is depicted. Examples of the tape 30 include a protective tape for protecting the front side of a workpiece such as a semiconductor wafer in grinding the back side of the workpiece, a dicing tape to be attached to a workpiece in dividing the workpiece into individual device chips by using a cutting blade or the like, and an expandable tape to be expanded in dividing a workpiece after forming a modified layer inside the workpiece by laser processing. The tape 30 has a front side 30a as an adhesive surface. A separator film 4 is previously attached to the front side 30a of the tape 30. The tape 30 with the separator film 4 attached thereto is rolled into a cylindrical shape in such a manner that the separator film 4 is positioned on the radially inside of the tape 30. Further, the front side 30a of the tape 30 is provided with a pattern for checking tension applied to the tape 30.

Figure 2:
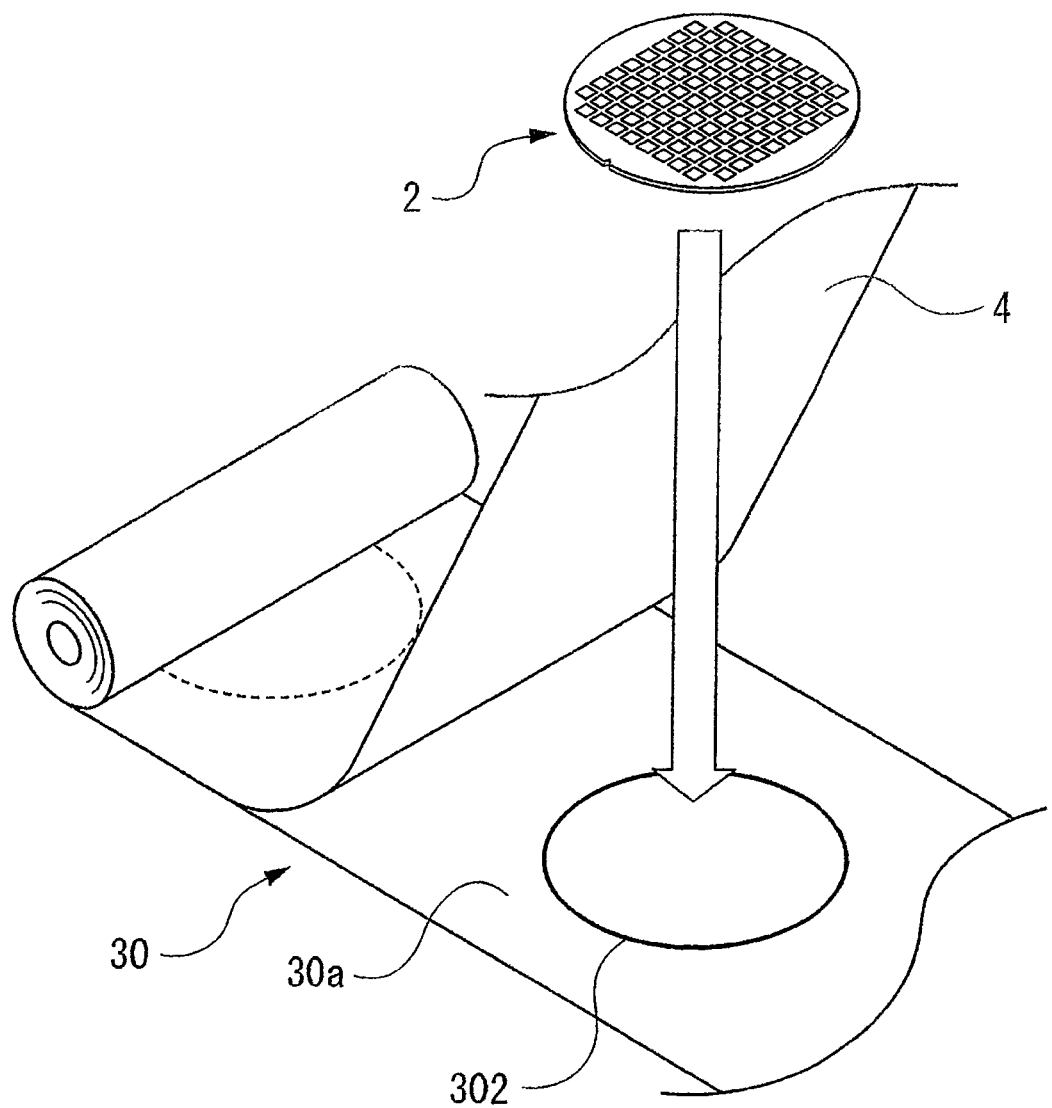
FIG. 2 is a perspective view depicting a workpiece and a tape having a pattern dedicated to the workpiece according to the present invention.
Figure 3:
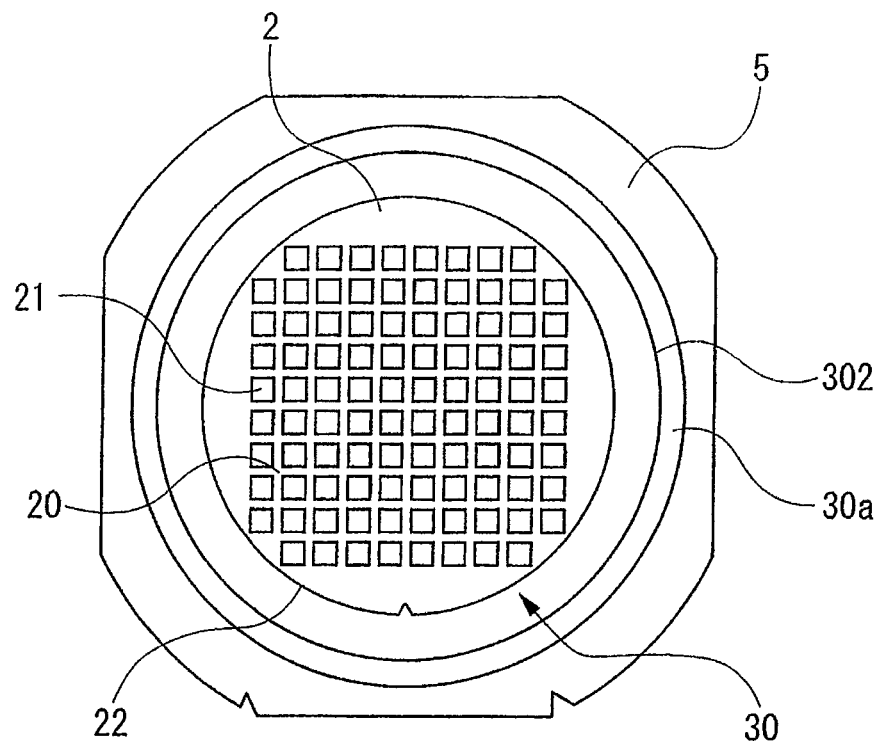
FIG. 3 is a plan view of the tape attached to the workpiece.

As depicted in FIG. 1, the pattern on the front side 30a of the tape 30 is a lattice-shaped pattern 300 formed on the whole surface of the front side 30a or a regular pattern 301 composed of a plurality of identical marks, e.g., a plurality of circular dots having the same size, arranged at regular intervals. The regular pattern 301 may be composed of a plurality of identical rectangles or crosses arranged at regular intervals, in place of the circular dots. As a modification, the pattern on the front side 30a of the tape 30 may be a ring-shaped pattern 302 as depicted in FIG. 2. The ring-shaped pattern 302 is a circle concentric with respect to a workpiece 2, e.g., a circular semiconductor wafer in this preferred embodiment when the workpiece 2 is attached to the tape 30 so as to be located inside this circle. That is, the ring-shaped pattern 302 has a diameter larger than that of the workpiece 2. In the case of the pattern 301 composed of the plural circular dots as depicted in FIG. 1, the tension applied to the tape 30 is checked by observing the shape of the dots deformed by the attachment of the workpiece 2 to the tape 30 or by the expansion of the tape 30 attached to the workpiece 2. FIG. 3 depicts a case where the workpiece 2 is attached to the adhesive surface 30a of the tape 30 and a ring-shaped frame 5 is also attached to the adhesive surface 30a so as to surround the workpiece 2. In this case, an annular area of the adhesive surface 30a between the outer circumference of the workpiece 2 and the inner circumference of the frame 5 is exposed. Further, the ring-shaped pattern 302 is located in this annular area of the adhesive surface 30a. In this case, the tension applied to the tape 30 is checked by determining whether the distance from the outer circumference 22 of the workpiece 2 to the inner circumference or outer circumference of the ring-shaped pattern 302 is a predetermined value after attaching the tape 30 to the workpiece 2 or expanding the tape 30 attached to the workpiece 2.

Preferably, the marks constituting the above various patterns have a color different from the background color of the front side 30a of the tape 30. Further, to prevent that the edge of each mark may become blurred, a color complementary to the background color of the front side 30a of the tape 30 is preferably avoided as the color of each mark.

The tape 30 is composed of a base sheet and an adhesive layer formed on the front side of the base sheet. The pattern on the front side 30a of the tape 30 may be formed by mixing a pigment or the like in the base sheet or the adhesive layer or may be drawn on the base sheet or the adhesive layer by using a paint or the like. Further, the pattern may be provided by a sheet-shaped coloring layer added to the base sheet and the adhesive layer.

2. Tape Attaching Method (1) Tape Preparing Step

The tape 30 having the pattern for checking the tension as depicted in FIG. 1, for example, is first prepared.

(2) Tape Attaching Step

Figure 4:
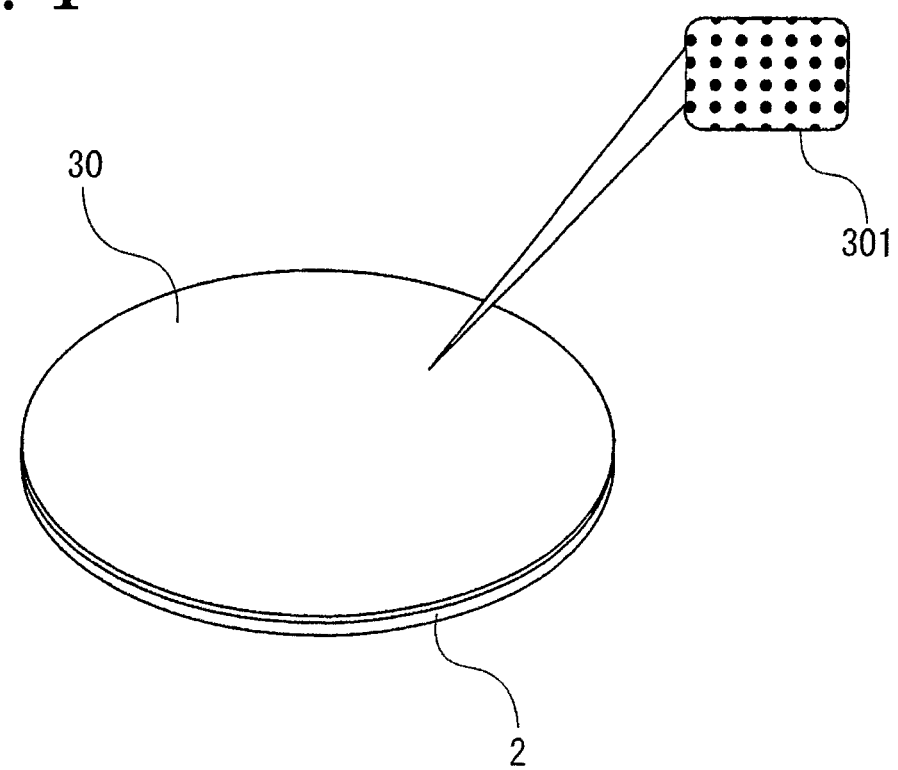
FIG. 4 is a perspective view depicting a tape attaching step in a tape attaching method according to the present invention.

As depicted in FIG. 4, the tape 30 is attached to the front side of the workpiece 2 by operator's hands or by using a mounter or the like. Further, the tape 30 attached to the front side of the workpiece 2 is cut along the outer circumference of the workpiece 2. As a modification, the tape 30 may be previously cut to have the same size and shape as those of the workpiece 2. Thereafter, the tape 30 may be attached to the front side of the workpiece 2 in such a manner that the center of the tape 30 coincides with the center of the workpiece 2.

(3) Determining Step

Figure 5:
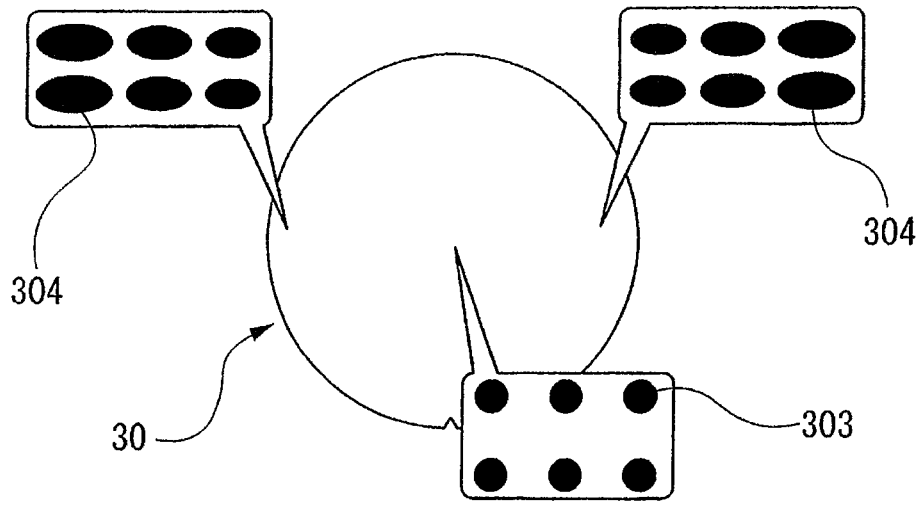
FIG. 5 is a schematic plan view depicting a determining step in the tape attaching method.

For example, the attached condition of the tape 30 is determined by the visual inspection of the shape of the pattern by the operator. As a modification, an imaging camera may be used to form an image of the pattern, and the degree of deformation of the pattern may be checked by viewing the image to thereby determine the attached condition. In this case, the area of each dot (the number of pixels of the pattern) before attachment and the area of each dot (the number of pixels of the pattern) after attachment may be compared with each other. Thereafter, when the area of each dot after attachment becomes greater than or equal to a predetermined threshold value, it may be determined that the attached condition is poor. FIG. 5 depicts an example using a dot pattern composed of plural circles 303 regularly arranged in the attached condition of the tape 30. As depicted in FIG. 5, each circle 303 at the central portion of the tape 30 keeps its original shape before attachment to the workpiece 2. In contrast, the circles 303 formed at the peripheral portion of the tape 30 are deformed to become elliptical as depicted by an ellipse 304 elongated radially outward. Accordingly, it can be said that tension is applied to the tape 30 in a radially inward direction from the outer circumference to the center of the tape 30. In this case, when the area of the ellipse 304 nearest to the outer circumference of the tape 30 is greater than or equal to a predetermined threshold value, it is determined that the attached condition is poor.

3. Tape Expanding Method

Figure 6:
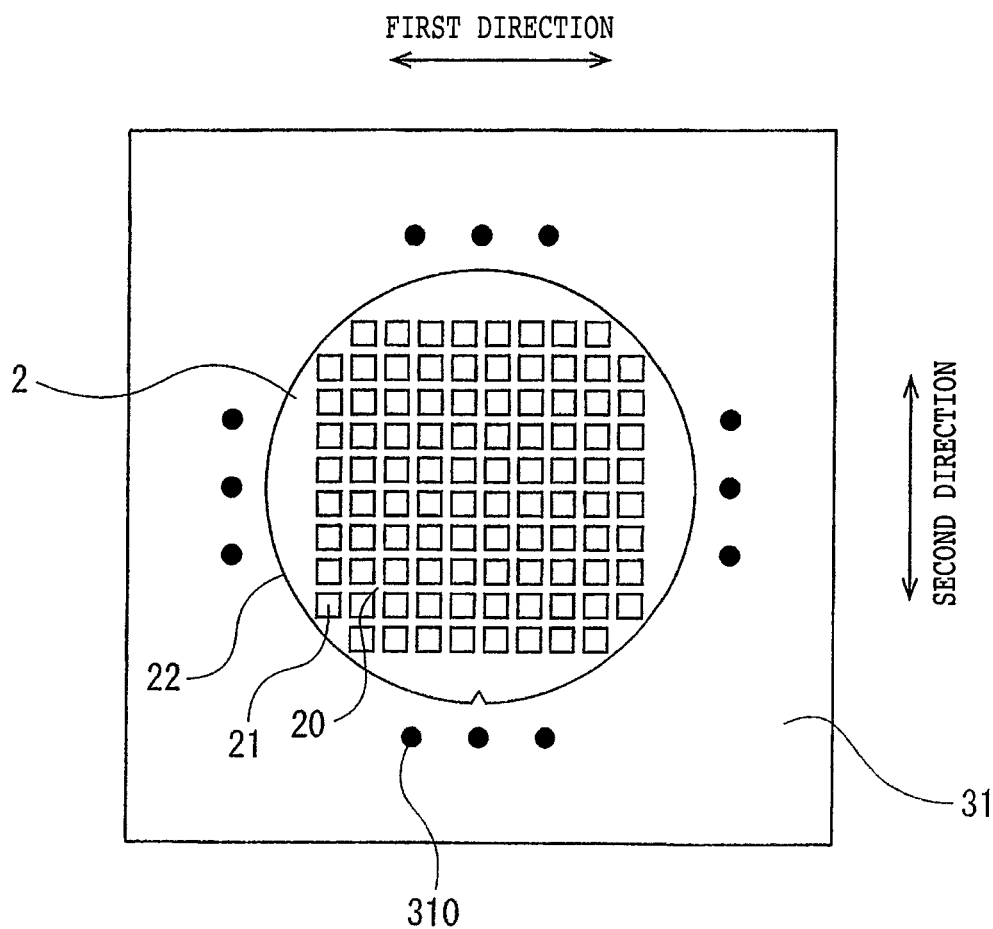
FIG. 6 is a plan view depicting an attaching step in a tape expanding method according to the present invention.

A tape expanding method using a tape 31 depicted in FIG. 6 will now be described. As depicted in FIG. 6, the tape 31 has a rectangular shape and the front side of the tape 31 is provided with a dot pattern composed of plural circular dots 310 for measuring tension applied to the tape 31. These plural circular dots 310 are composed of four groups of three dots arranged parallel to the four sides (side edges) of the rectangular tape 31, respectively. While the dot pattern composed of the plural circular dots 310 is depicted in FIG. 6, the pattern on the front side of the tape 31 is not limited to such a dot pattern depicted in FIG. 6. That is, the pattern on the front side of the tape 31 may be any pattern composed of any identical marks regularly arranged. That is, the pattern composed of the circular dots 310 depicted in FIG. 6 is merely illustrative.

In FIG. 6, the workpiece 2 is previously attached to the front side (adhesive surface) of the tape 31. A plurality of crossing division lines 20 are formed on the front side of the workpiece 2 to thereby define a plurality of rectangular separate regions where a plurality of devices 21 are previously formed. Further, a modified layer (not depicted) is previously formed inside the workpiece 2 along each division line 20 by applying a laser beam.

The tape 31 with the workpiece 2 attached thereto is expanded according to the following tape expanding method. The tape expanding method includes an attaching step, an expanding step, and a tension checking step.

(1) Attaching Step

First, the tape 31 having the dot pattern composed of the plural circular dot 310 is attached to the workpiece 2 as depicted in FIG. 6. As described above, the three circular dots 310 are arranged at regular intervals along each side edge of the rectangular tape 31. A center one of these three circular dots 310 arranged along each side edge of the rectangular tape 31 is located at the intermediate position of the workpiece 2 in a first direction or in a second direction perpendicular to the first direction.

(2) Expanding Step

Figure 7:
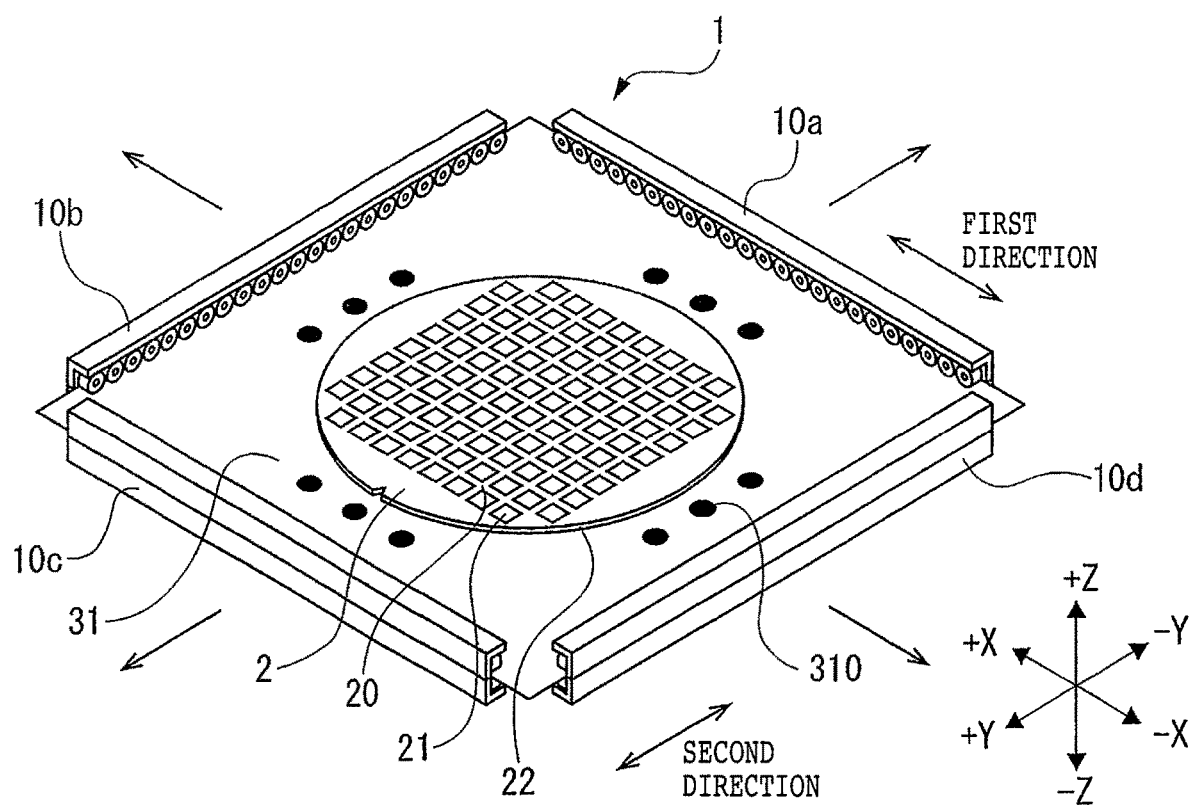
FIG. 7 is a perspective view depicting an expanding step in the tape expanding method.

After performing the attaching step, the tape 31 is expanded by using a tape expanding apparatus 1 depicted in FIG. 7. The tape expanding apparatus 1 includes four holding means (holding units) 10a, 10b, 10c, and 10d holding four edge portions of the tape 31 along the four side edges thereof, respectively. In FIG. 7, the two holding means 10b and 10d are opposed to each other in the first direction. In other words, the two holding means 10b and 10d extend parallel to each other in the second direction. On the other hand, the two holding means 10a and 10c are opposed to each other in the second direction. In other words, the two holding means 10a and 10c extend parallel to each other in the first direction. By operating moving means (not depicted), the two holding means 10b and 10d are moved away from each other to thereby expand the tape 31 in the first direction. Similarly, by operating the moving means, the two holding means 10a and 10c are moved away from each other to thereby expand the tape 31 in the second direction.

(3) Tension Checking Step

The tension checking step may be performed before expansion of the tape 31, during expansion of the tape 31, or after expansion of the tape 31. The tension applied to the tape 31 may be checked by the visual inspection of the shape of the pattern by the operator or may be checked by using an imaging camera to form an image of the pattern and by performing image processing to check the degree of deformation of the pattern.

In the case where the tension checking step is performed before expansion of the tape 31, the direction where the tension is applied to the tape 31 is checked. In the direction where the tension is applied to the tape 31, the tape 31 is not expanded. Accordingly, by increasing the amount of expansion of the tape 31 in the direction where the tension is not applied to the tape 31, the amount of expansion in the first direction can be made equal to the amount of expansion in the second direction.

Figure 8:
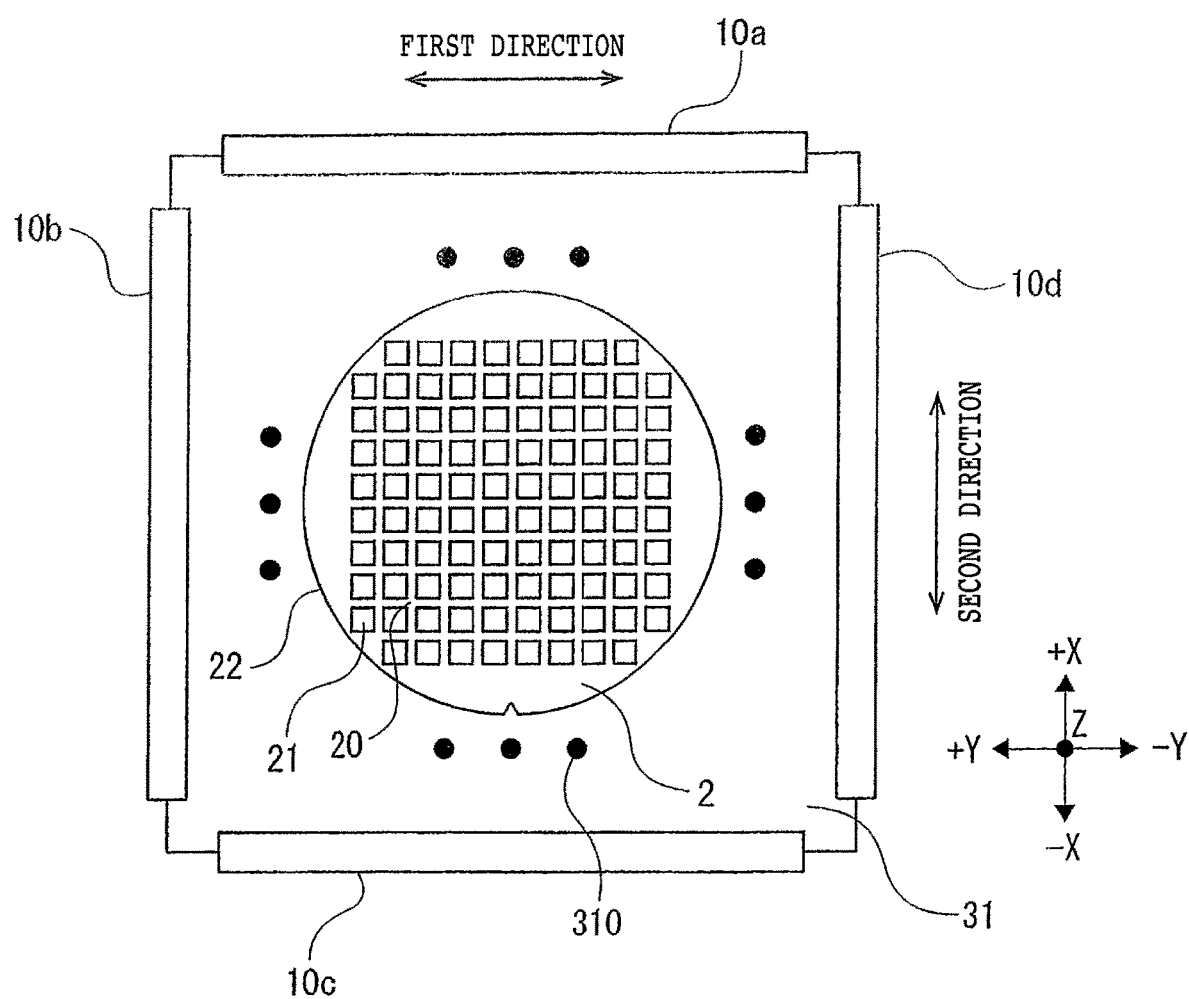
FIG. 8 is a plan view depicting an example of a tension checking step in the tape expanding method.
Figure 9:
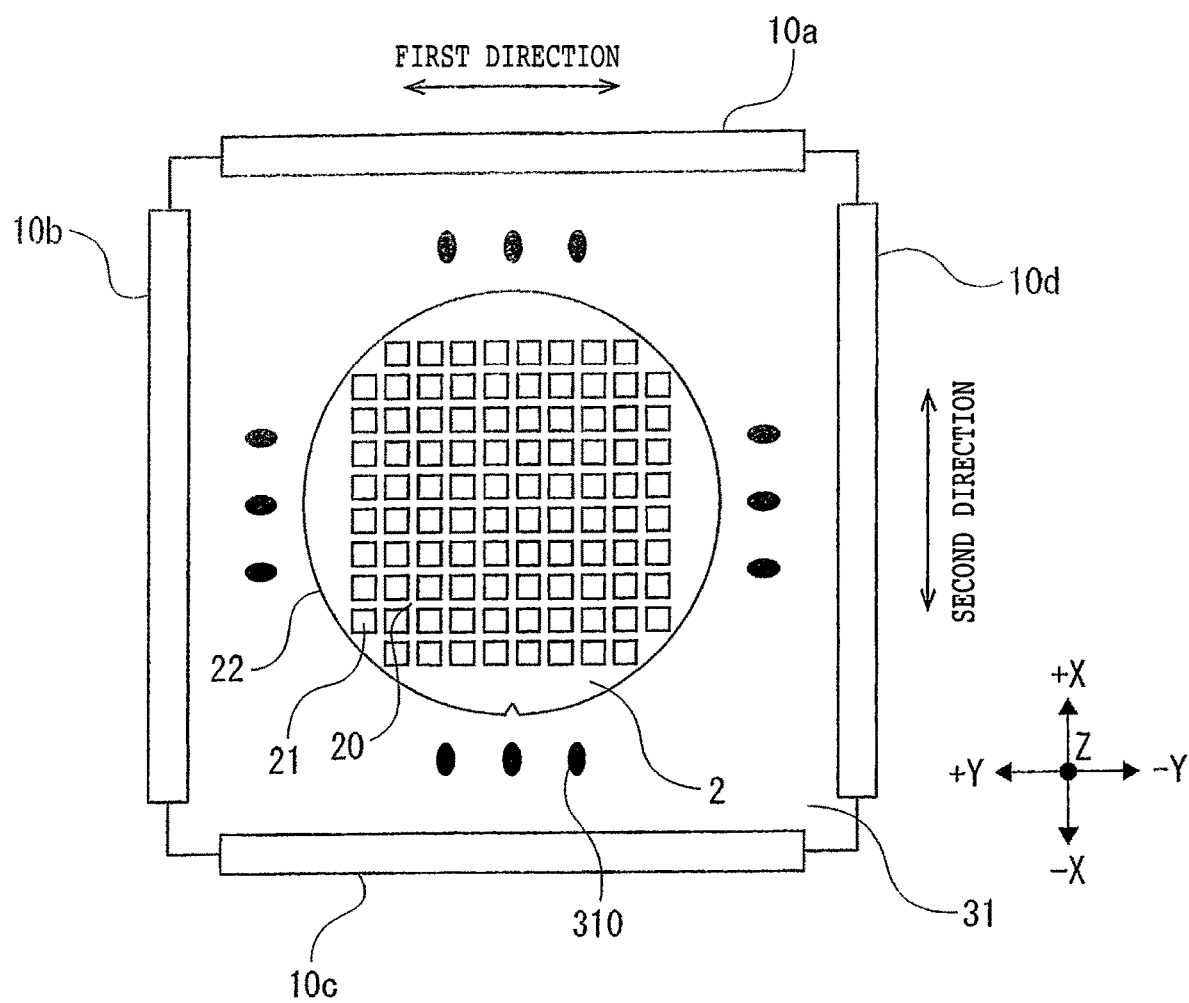
FIG. 9 is a plan view depicting another example of the tension checking step.

In the case where the tension checking step is performed during expansion of the tape 31, a change in shape or position of each dot 310 during expansion of the tape 31 is checked to thereby determine whether or not the amount of expansion of the tape 31 has reached a predetermined amount. FIG. 8 depicts a case where a change in position of each dot 310 is checked during expansion of the tape 31. In this case, the expansion of the tape 31 is stopped when the edge of each dot 310 nearest to the workpiece 2 has become a position from the outer circumference 22 of the workpiece 2 by a distance of 20 mm, for example. FIG. 9 depicts another case where a change in shape of each dot 310 is checked during expansion of the tape 31. In this case, the expansion of the tape 31 is stopped when each circular dot 310 has become an ellipse and the length of the major axis of this ellipse has become greater than a predetermined threshold value.

In the case where the tension checking step is performed after expansion of the tape 31, it is checked whether or not the amount of expansion is sufficient, according to the change in shape or position of each dot 310. Further, in the case where the three dots 310 arranged along each side edge of the tape 31 are not aligned or in the case where the center one of the three dots 310 arranged along each side edge of the tape 31 is not located at the middle position of the workpiece 2 in the first direction or in the second direction, it is determined that the balance of the tension in the first direction or in the second direction is lost.

For various kinds of tapes, the correlation between the tension and the degree of change in the pattern may be previously recorded and the tension may be determined according to the degree of change in the pattern by referring to the above correlation recorded. In this case, it is possible to check any warpage or tension in the workpiece caused in forming a modified layer in the workpiece by using a laser beam.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A tape adapted to be attached to a workpiece, the tape comprising:
    a substrate having two opposing sides;
    an adhesive on one of said sides of said substrate; and
    a deformable pattern visible from an entirety of said sides of said substrate, wherein said pattern may deform in at least two directions when tension is applied to the tape and said substrate is stretched in at least one of said at least two directions, wherein said substrate is a first color and said pattern is a second color, and wherein said first color and said second color are different.

2. The tape according to claim 1, wherein the pattern is provided on the whole surface of said one of said sides of the substrate.

3. A tape attaching method for attaching a tape to a workpiece the tape attaching method comprising:
    a tape preparing step of preparing the tape, wherein the tape includes opposing sides, an adhesive and a deformable pattern on a same side of said sides of the tape, wherein the tape is a first color and said pattern is a second color, and wherein said first color and said second color are different, and wherein said pattern is visible from an entirety of said sides of said tape;
    a tape attaching step of attaching the tape to the workpiece; and
    a determining step of checking the tension applied to the tape according to deformation of the pattern by stretching the tape in at least one direction after performing the tape attaching step, and then determining whether or not an attached condition of the tape to the workpiece is good.

4. A tape expanding method for expanding a tape attached to a workpiece, the tape expanding method comprising:
    an attaching step of attaching the tape to the workpiece, wherein the tape includes opposing sides, an adhesive and a deformable pattern on a same side of said sides of the tape, wherein the tape is a first color and said pattern is a second color, and wherein said first color and said second color are different, and wherein said pattern is visible from an entirety of said sides of said tape;
    an expanding step of expanding the tape after performing the attaching step; and a tension checking step of checking the tension applied to the tape to stretch the tape in at least one direction according to deformation of the pattern.

5. The tape according to claim 1, further comprising a separator film attached to said one of said sides of the substrate.

6. The tape attaching method according to claim 3, wherein the tape preparing step includes attaching a separator film to said same side of the tape.

7. The tape expanding method according to claim 4, wherein the tape includes a separator film attached to said same side of the tape.

8. The tape attaching method according to claim 3, wherein the tape preparing step includes providing the pattern on the whole surface of said same side of the tape.

9. The tape expanding method according to claim 4, wherein the pattern on the tape is provided on the whole surface of said same side of the tape.

10. The tape according to claim 1, wherein the pattern includes a plurality of identical marks.

\* \* \* \* \*